(12) United States Patent
Kaneko

(10) Patent No.: US 8,284,588 B2
(45) Date of Patent: *Oct. 9, 2012

(54) NON-VOLATILE LOGIC CIRCUIT AND A METHOD FOR OPERATING THE SAME

(75) Inventor: Yukihiro Kaneko, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/220,222

(22) Filed: Aug. 29, 2011

(65) Prior Publication Data

US 2011/0309858 A1    Dec. 22, 2011

Related U.S. Application Data

(63) Continuation of application No. PCT/JP2011/001116, filed on Feb. 25, 2011.

(30) Foreign Application Priority Data

May 11, 2010    (JP) .................................. 2010-108887

(51) Int. Cl.
*G11C 11/22*    (2006.01)

(52) U.S. Cl. ............. 365/145; 365/63; 365/65; 365/129; 365/130; 365/233.16; 365/233.17; 365/242

(58) Field of Classification Search .................... 365/63, 365/65, 129, 130, 145, 233.16, 233.17, 242; 326/38

See application file for complete search history.

(56) References Cited

U.S. PATENT DOCUMENTS

| 2006/0114018 A1 | 6/2006 | Sugahara et al. |
| 2006/0139844 A1 | 6/2006 | Kameyama et al. |
| 2009/0097299 A1 | 4/2009 | Tanaka et al. |

*Primary Examiner* — Fernando Hidalgo
(74) *Attorney, Agent, or Firm* — McDermott Will & Emery LLP

(57) ABSTRACT

In a non-volatile logic circuit, a first input electrode and a second input electrode are formed on a semiconductor layer and interposed between an electric current source electrode and an output electrode in a plan view. The first input electrode is next to the second input electrode along the a direction orthogonal to the direction between the electric current source electrode and the output electrode. A method of operating the non-volatile logic circuit includes a step of writing one state selected from four states by applying voltages to the first input electrode and the second input electrode, respectively, and a step of measuring current generated by applying the voltage between the electric current power electrode and the output electrode to determine on the basis of the current, which of the high or low resistant state the non-volatile logic circuit has.

4 Claims, 6 Drawing Sheets

| | Output Resistance (MΩ) |
|---|---|
| First State | 0.3312 |
| Second State | 0.6620 |
| Third State | 0.6532 |
| Fourth State | 1120 |

| INPUT 1 | INPUT 2 | OUTPUT |
|---------|---------|--------|
| 1 | 1 | 1 |
| 0 | 1 | 1 |
| 1 | 0 | 1 |
| 0 | 0 | 0 |

|  | Reference Numbers in Fig.1 | | Output Resistance |
| --- | --- | --- | --- |
|  | 17a | 17b |  |
| First State | -10 | -10 | Low |
| Second State | 10 | -10 | Low |
| Third State | -10 | 10 | Low |
| Fourth State | 10 | 10 | High |

Unit : Volt

Fig. 4

| | Output Resistance (MΩ) |
|---|---|
| First State | 0.3312 |
| Second State | 0.6620 |
| Third State | 0.6532 |
| Fourth State | 1120 |

NON-VOLATILE LOGIC CIRCUIT AND A METHOD FOR OPERATING THE SAME

RELATED APPLICATIONS

This application is a continuation of PCT International Application PCT/JP2011/001116 filed on Feb. 25, 2011, which claims priority to Japanese Patent Application No. 2010-108887 filed on May 11, 2010. The disclosures of these applications including the specifications, the drawings, and the claims are hereby incorporated by reference in their entirety.

TECHNICAL FIELD

The present disclosure relates to a non-volatile logic circuit and a method for operating the same comprising a laminate formed of a ferroelectric film and a semiconductor film.

BACKGROUND

Patent Document 1 discloses a non-volatile switching device. FIGS. 8A and 8B show a conventional non-volatile switching device disclosed in FIG. 3 of Patent Document 1.

As shown in FIG. 8A, the non-volatile switching device comprises a substrate 11, a control electrode 12, a ferroelectric layer 13, a semiconductor layer 14, and first to third electrodes 15a to 15c. The control electrode 12, the ferroelectric layer 13, and the semiconductor layer 14 are stacked in this order on the substrate 11. The first to third electrodes 15a to 15c are provided on the semiconductor layer 14.

A voltage is applied between the control electrode 12 and the first to third electrodes 15a to 15c to change the polarization direction of the ferroelectric layer 13.

In a case where a part of the ferroelectric layer 13 has an upward polarization direction, the part of the semiconductor layer 14 stacked on the part of the ferroelectric layer 13 has low resistance. This corresponds to the ON-state.

On the contrary, in a case where a part of the ferroelectric layer 13 has a downward polarization direction, the part of the semiconductor layer 14 stacked on the part of the ferroelectric layer 13 has high resistance. This corresponds to the OFF-state.

In FIG. 8A, only the part of the ferroelectric layer 13 positioned below the third electrode 15c has downward polarization direction. Accordingly, as shown in FIG. 8B, a current flows selectively from the first electrode 15a to the second electrode 15b.

PRIOR ARTS

[Patent Document]
[Patent Document1] Japanese laid-open patent publication No. 2009-099606

SUMMARY

The purpose of the present disclosure is to provide a novel non-volatile logic circuit and a method for operating the same utilizing the change of resistance states shown in FIG. 8.

In order to accomplish above described purpose, one aspect of the present disclosure provides a method of operating a non-volatile logic circuit. This method comprises the following steps (a) to (c): A step (a) is preparing the non-volatile logic circuit. The non-volatile logic circuit comprises a control electrode, a ferroelectric layer, a semiconductor layer, and an electrode group. The control electrode, the ferroelectric layer, the semiconductor layer, and the electrode group are stacked in this order. The electrode group comprises a electric current power electrode, an output electrode, a first input electrode, and a second input electrode. When X direction, Y-direction, and Z-direction denote a longitudinal direction of the ferroelectric layer, a direction orthogonal to the longitudinal direction, and a stacking direction, respectively, the first input electrode and the second input electrode are interposed between the electric current power electrode and the output electrode along the X-direction, and the first input electrode is next to the second input electrode along the Y-direction, A step (b) is writing one state selected from the group consisting of first, second, third, and fourth states into the non-volatile logic circuit. V1, Va, and Vb are voltages applied to the control electrode, the first input electrode, and the second input electrode, respectively. When the first state is written, voltages being applied which satisfy inequalities: V1>Va and V1>Vb. When the second state is written, voltages being applied which satisfy inequalities: V1<Va and V1>Vb. When the third state is written, voltages being applied which satisfy inequalities: V1>Va and V1<Vb. When the fourth state is written, voltages being applied which satisfy inequalities: V1<Va and V1<Vb. The first, second and third states are low resistant states, and the fourth state is a high resistant state.

A step (c) is measuring current generated by applying an voltage between the electric current power electrode and the output electrode to determine on the basis of the current which of the high or low resistant state the non-volatile logic circuit has.

The method may further comprise the following step between the step (a) and the step (b): applying a voltage Vin to the first and second input electrodes and a voltage Vreset (the Vreset> the Vin) to the control electrode to reset the non-volatile logic circuit.

In the step (b), a first input signal which is either true or false may be input to the first input electrode, and a second input signal which is either true or false may be input to the second input electrode. In the step (c), the high resistant state may correspond to false of logical disjunction on the basis of the first and second input signals, and the low resistant state may correspond to true of logical disjunction on the basis of the first and second input signals.

The method may further comprise the following step between the step (a) and the step (b): turning off the non-volatile logic circuit.

The present subject matter provides a novel non-volatile logic circuit and a method for operating the same.

BRIEF DESCRIPTION OF DRAWINGS

FIG. 4 shows the voltages of the input electrodes 17a-17b during writing.

DESCRIPTION OF EMBODIMENTS

The embodiment of the present subject matter is described below with reference to the drawings.

(Embodiment 1)

Figure 1A:
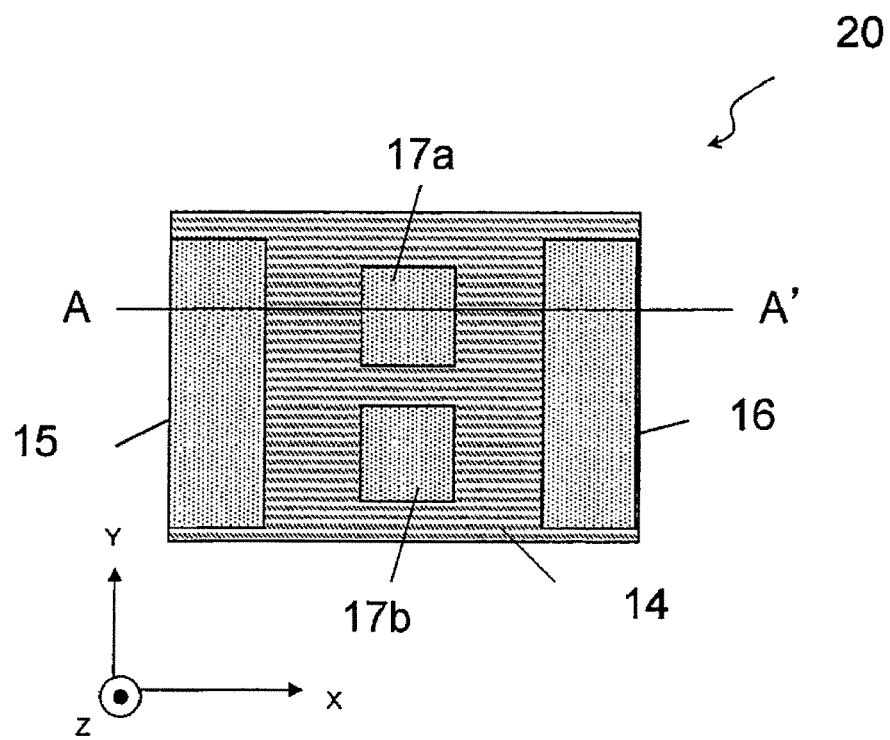
FIG. 1A shows an exemplary top view of the nonvolatile logic circuit according to the embodiment 1.
Figure 1B:
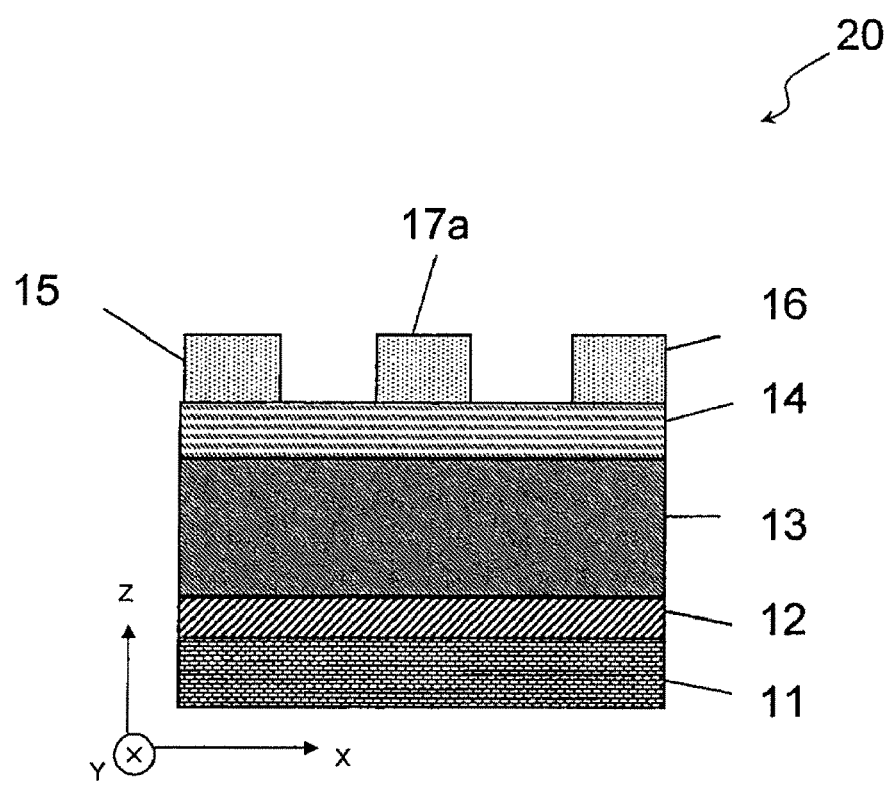
FIG. 1B shows a cross-sectional view of A-A' line in FIG. 1A.

FIG. 1A shows a top view of the nonvolatile logic circuit according to the embodiment 1. FIG. 1B shows a cross-sectional view of the A-A' line in FIG. 1A.

As shown in FIG. 1A and FIG. 1B, a ferroelectric film 13 and a semiconductor film 14 are stacked on a substrate 11. A control electrode 12 is interposed between the ferroelectric film 13 and the substrate 11.

An electrode group is formed on the semiconductor film 14. The electrode group comprises a power electrode 15, an output electrode 16, a first input electrode 17a, and a second input electrode 17b. In a top view, the input electrodes 17a-17b are interposed between the power electrode 15 and the output electrode 16.

The disposition relationship of the input electrodes 17a-17b is described below in more detail.

As shown in FIG. 1A and FIG. 1B, X-direction, Y-direction, and Z-direction denote the longitudinal direction of the ferroelectric film 13, the direction orthogonal to the longitudinal direction, and the stacking direction of the films 13-14, respectively.

The first input electrode 17a and the second input electrode 17b are interposed between the power electrode 15 and the output electrode 16.

Along the X-direction, the first input electrode 17a is interposed between the power electrode 15 and the output electrode 16. The second input electrode 17b is interposed between the power electrode 15 and the output electrode 16.

Along the Y-direction, the first input electrode 17a is adjacent to the second input electrode 17b.

In the nonvolatile logic circuit 20, the current flowing through the semiconductor film 14 is determined depending on the direction of the polarization in the ferroelectric film 13. Namely, when the polarization direction of the ferroelectric film 13 agrees with the +Z direction, the electrons induced in the semiconductor film 14 causes the semiconductor film 14 to have low resistance. On the contrary, when the polarization direction of the ferroelectric film 13 agrees with the −Z direction, the expulsion of the electrons from the semiconductor film 14 causes the semiconductor film 14 to have high resistance.

Voltages between the input electrodes 17a-17b and the control electrode 12 are applied to modify the resistance value of the semiconductor film 14. As a result, the resistance value between the power electrode 15 and the output electrode 16 varies.

Figures 2, 3:
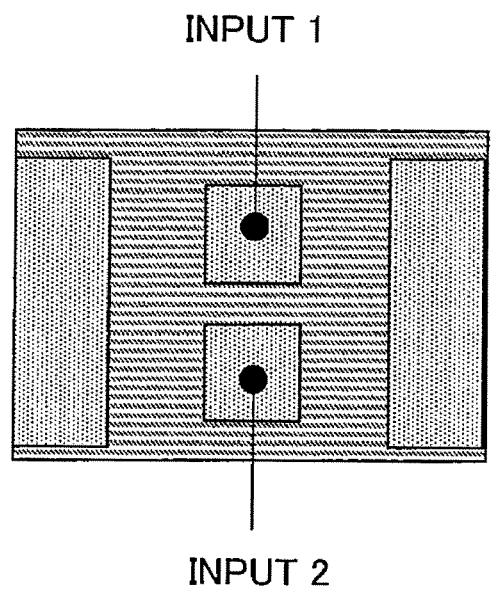
FIG. 2 shows an exemplary top view of the nonvolatile logic circuit according to the embodiment 1.
FIG. 3 shows a table of the truth value in the embodiment 1.

The nonvolatile logic circuit 20 performs a logical disjunction of two inputs-one output. Two input signals are consisted of a first input signal and a second input signal. As shown in FIG. 2, the first input signal and the second input signal are input to the first input electrode 17a and the second input electrode 17b, respectively. The execution result of the logical disjunction is output on the basis of the table of the truth value shown in FIG. 3.

(Writing into the Non-volatile Logic Circuit 20)

Next, the writing data into the non-volatile logic circuit 20 is described with reference to FIG. 4, FIG. 5, and FIG. 6.

FIG. 4 shows the voltages of the input electrodes 17a-17b during writing. A voltage of −10 V is input as "1" shown in FIG. 3. A voltage of 10 V is input as "0". The voltage at the control electrode 12 is maintained at a constant value, which is preferably 0 volts.

Figure 5A:
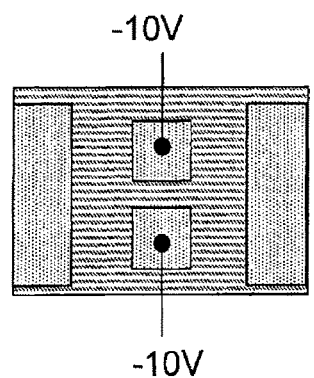
FIG. 5A shows an exemplary top view of the input electrodes 17a-17b in the first condition.

FIG. 5A shows a top view of the input electrodes 17a-17b in the first condition.

Figure 5B:
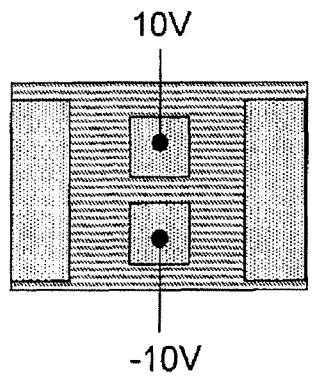
FIG. 5B shows an exemplary top view of the input electrodes 17a-17b in the second condition.

FIG. 5B shows a top view of the input electrodes 17a-17b in the second condition.

Figure 5C:
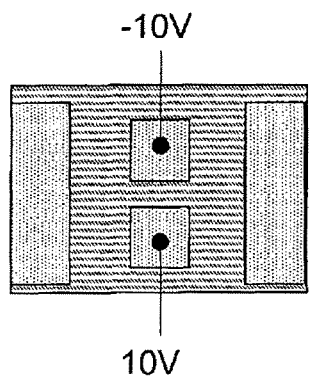
FIG. 5C shows an exemplary top view of the input electrodes 17a-17b in the third condition.

FIG. 5C shows a top view of the input electrodes 17a-17b in the third condition.

Figure 5D:
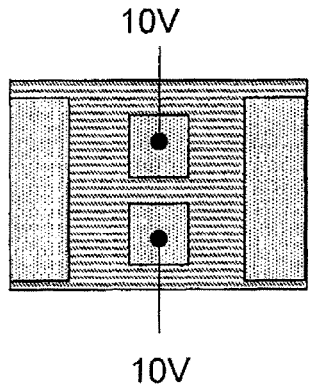
FIG. 5D shows an exemplary top view of the input electrodes 17a-17b in the fourth condition.

FIG. 5D shows a top view of the input electrodes 17a-17b in the fourth condition.

Figures 6, 7:
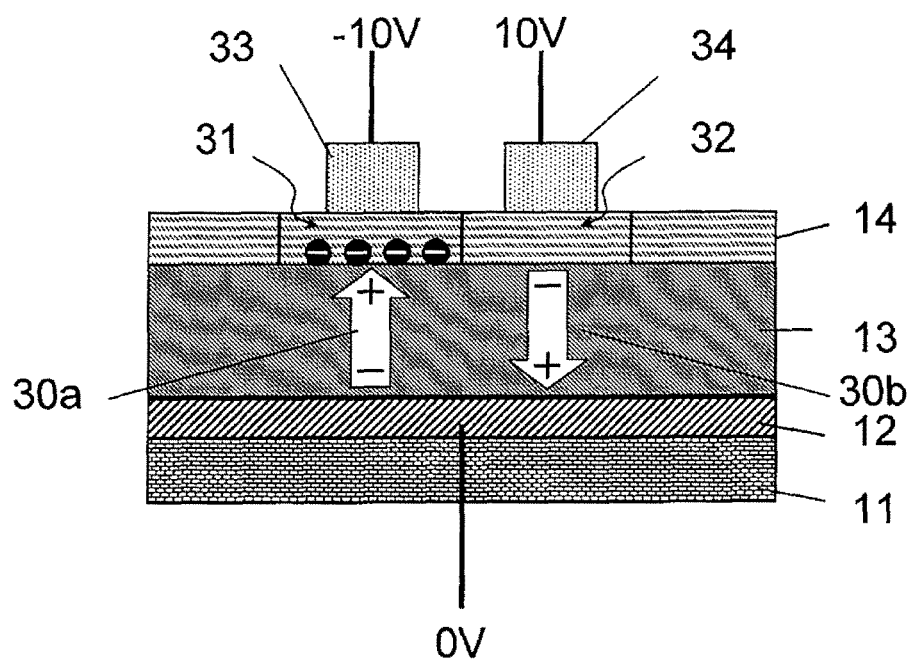
FIG. 6 shows a polarization condition of the ferroelectric film 13 and the condition of the semiconductor film 14 when the voltage of −10 volts and the voltage of 10 volts are applied to the first input electrode 17a and the second input electrode 17b, respectively.
FIG. 7 shows resistance values calculated in the first to fourth states.
Figure 8A:
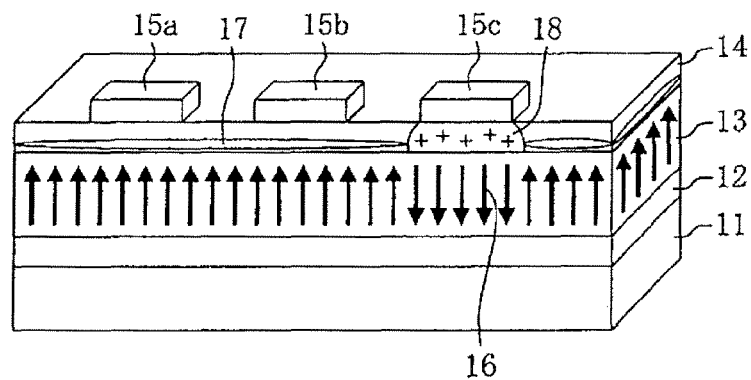
FIG. 8A shows a conventional non-volatile switching device disclosed in FIG. 3 of Patent Document 1.
Figure 8B:
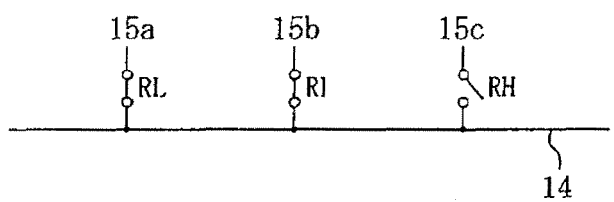
FIG. 8B shows the current flow from one electrode to another electrode in a conventional non-volatile switching device disclosed in FIG. 3 of Patent Document 1.

FIG. 6 illustrates the polarization condition of the ferroelectric film 13 and the condition of the semiconductor film 14 when the voltage of −10 volts and the voltage of 10 volts are applied to the first input electrode 17a and the second input electrode 17b. The semiconductor region 31 located below the input electrode 33, to which −10 V is applied, has low resistance because of accumulation of electrons caused by the polarization 30a of the ferroelectric film 13. On the contrary, the semiconductor region 32 located below the input electrode 34, to which 10 V is applied, has high resistance because the electrons have been expelled due to the polarization 30b of the ferroelectric film 13.

The writing procedures of the first, second, third and fourth conditions are described below.

Preferably, a reset operation is performed before starting the writing operation. In the reset operation, a voltage Vin is applied to the input electrodes 17a-17d, and a voltage Vreset, which satisfies Vin<Vreset, is applied to the control electrode 12. Specifically, it is preferred that 0 volts be applied to the input electrodes 17a-17d while 10 volts be applied to the control electrode 12. Thus, all of the polarization directions in the ferroelectric film 13 are configured to be upward.

The reset operation allows the nonvolatile logic circuit 20 to be operated with high reproducibility.

During writing, V1, Va, and Vb are applied respectively to the control electrode 12, the first input electrode 17a, and the second input electrode 17b to polarize the respective portions of the ferroelectric film 13 located below the input electrodes 17a-17b. This polarization causes the respective regions of the semiconductor film 14 located below the input electrodes 17a-17b to have high or low resistance. One condition selected from the first, second, third, and fourth conditions is written into the nonvolatile logic circuit 20.

When the first state is written, the voltages V1, Va, and Vb, which satisfy the following relationship (I), are applied:

$$V1 > Va \text{ and } V1 > Vb \tag{I}$$

Specifically, while V1 is maintained at 0 volts, Va of −10 volts, and Vb of −10 volts are applied.

When −10V and +10V correspond to true (1) and false (0) respectively, true (1) and true (1) are input to the first input electrode 17a and the second input electrode 17b, respectively, in the first state.

When the second state is written, the voltages V1, Va, and Vb, which satisfy the following relationship (II), are applied:

$$V1<Va \text{ and } V1>Vb \qquad (II).$$

Specifically, while V1 is maintained at 0 volts, Va of +10 volts, and Vb of −10 volts are applied.

False (0) and true (1) are input to the first input electrode 17a and the second input electrode 17b, respectively, in the second state.

When the third state is written, the voltages V1, Va, and Vb, which satisfy the following relationship (III), are applied:

$$V1>Va \text{ and } V1<Vb \qquad (III).$$

Specifically, while V1 is maintained at 0 volts, Va of −10 volts, and Vb of +10 volts are applied.

True (1) and false (0) are input to the first input electrode 17a and the second input electrode 17b, respectively, in the third state.

When the fourth state is written, the voltages V1, Va, and Vb, which satisfy the following relationship (IV), are applied:

$$V1<Va \text{ and } V1<Vb \qquad (IV).$$

Specifically, while V1 is maintained at 0 volts, Va of +10 volts, and Vb of +10 volts are applied.

False (0) and false (0) are input to the first input electrode 17a and the second input electrode 17b, respectively, in the fourth state.

In the first, second, and third states, the resistance between the power electrode 15 and the output electrode 16 is high. In the fourth state, the resistance between the power electrode 15 and the output electrode 16 is low.

As understood from the relationship between true (1) and false (0) which are input in the first to fourth states, the first input signal, which is either true or false, is input to the first input electrode 17a. The second input signal, which is either true or false, is input to the second input electrode 17b.

(Reading from the Nonvolatile Logic Circuit 20)

An example of the reading data from the nonvolatile logic circuit 20 is described below.

While, for example, 0 volts is applied to the control electrode 12 and the input electrodes 17a-17b, a potential difference is applied between the power electrode 15 and the output electrode 16 to measure the current flowing through the semiconductor film 14.

The potential difference applied between the power electrode 15 and the output electrode 16 is preferably one-fifth times or less of the voltage applied to the input electrodes 17a-17b in the writing. For example, the potential difference applied between the power electrode 15 and the output electrode 16 may be 0.1 volts.

The resistance value is determined depending on the value of the current. Namely, based on the current measured, it is determined which of high-resistance state or low-resistance state the nonvolatile logic circuit 20 has. As described above, the first, second, and third states are the low-resistance states. The fourth state is the high-resistance state.

The high-resistance state corresponds to the "false" of the logical addition (OR) based on the first input signal and the second input signal. The low-resistance state corresponds to the "true" of the logical addition (OR) based on the first input signal and the second input signal. In this matter, the nonvolatile logic circuit 20 serves as a nonvolatile logical addition circuit (i.e., an OR circuit).

EXAMPLE

The following example describes the present subject matter in more detail.

Example 1

As a substrate 11, a silicon substrate having a surface covered by a silicon oxide film was prepared.

(1) The control electrode 12 was formed on the substrate 11 in accordance with the following procedure. A Ti film with a thickness of 5 nanometers and a Pt film with a thickness of 30 nanometers were formed in this order by an electron gun deposition method. Next, a $SrRuO_3$ (hereinafter, referred to as "SRO") film with a thickness of 10 nanometers was formed by a pulse laser deposition method.

(2) The substrate was heated to 700 degrees Celsius, and the ferroelectric film 13 consisted of $Pb(Zr,Ti)O_3$ with a thickness of 450 nanometers was formed by pulse laser deposition method.

(3) The substrate temperature is set at 400 degrees Celsius, and the semiconductor film 14 consisted of ZnO with thickness of 30 nanometers was formed.

(4) A resist pattern was formed on the semiconductor film 14 with the use of photolithography. Subsequently, the portion of the semiconductor film 14 which the resist pattern did not cover was removed by etching with use of nitric acid.

(5) Subsequently, the resist on the semiconductor film 14 was patterned with use of photolithography. A Ti film with a thickness of 5 nanometers and a Pt film with a thickness of 30 nanometers were formed by an electron gun deposition method. The resist was removed to form the power electrode 15, the output electrode 16, and the input electrodes 17a-17b.

The obtained nonvolatile logic circuit had 100-square-micrometer input electrodes and an electrode interval of 10 micrometers. The first to fourth states were written into the nonvolatile logic circuit on the basis of FIG. 4 and FIG. 5. Subsequently, a voltage of 0.1 volts was applied between the power electrode 15 and the input electrode 16 to measure the current flowing between the power electrode 15 and the input electrode 16. The resistance value of the nonvolatile logic circuit was calculated from the measured current.

FIG. 7 shows resistance values calculated in the first to fourth states. As understood from FIG. 7, the first, second, and third states have low resistance values. On the contrary, the fourth state has a high resistance value.

In the present example, the control electrode 12 having a laminate of SRO/Pt/Ti, the power electrode 15 having a laminate of Pt/Ti, the output electrode 16, and the input electrodes 17a-17b were used. A laminate including other materials may be also used.

As the material of the ferroelectric film 13, other ferroelectric materials such as $Sr(Bi,Ta)O_x$ or $BiTiO_x$ may be used. As the material of the semiconductor 14, other semiconductor materials such as GaN or $InGaZnO_x$ may be used.

[Industrial Applicability]

The present subject matter provides a novel nonvolatile logic circuit and a method for operating the nonvolatile logic circuit.

REFERENCE SIGNS LIST

11: substrate
12: control electrode
13: ferroelectric film
14: semiconductor film
15: power electrode
16: output electrode
17a: first input electrode
17b: second input electrode
20: nonvolatile logic circuit
30a: upward polarization in the ferroelectric film 30b: downward polarization in the ferroelectric film
31: low resistance portion in the semiconductor film
32: high resistance portion in the semiconductor film
33: input electrode in which the signal "1" is inputted
34: input electrode in which the signal "0" is inputted

The invention claimed is:

1. A method of operating a non-volatile logic circuit, comprising:
    a step (a) of preparing the non-volatile logic circuit, wherein:
    the non-volatile logic circuit comprises a control electrode, a ferroelectric layer, a semiconductor layer, and an electrode group,
    the control electrode, the ferroelectric layer, the semiconductor layer, and the electrode group are stacked in this order,
    the electrode group comprises a electric current power electrode, an output electrode, a first input electrode, and a second input electrode,
    X direction, Y-direction, and Z-direction denote a longitudinal direction of the ferroelectric layer, a direction orthogonal to the longitudinal direction, and a stacking direction, respectively,
    the first input electrode and the second input electrode are interposed between the electric current power electrode and the output electrode along the X-direction, and
    the first input electrode is next to the second input electrode along the Y-direction;
    a step (b) of writing one state selected from the group consisting of first, second, third, and fourth states into the non-volatile logic circuit, wherein:
        V1, Va, and Vb are voltages applied to the control electrode, the first input electrode, and the second input electrode, respectively,
        when the first state is written, voltages which satisfy V1>Va and V1>Vb are applied,
        when the second state is written, voltages which satisfy V1<Va and V1>Vb are applied,
        when the third state is written, voltages which satisfy V1>Va and V1<Vb are applied,
        when the fourth state is written, voltages which satisfy V1<Va and V1<Vb are applied, and
        the first, second and third states are low resistant states, and the fourth state is a high resistant state; and
    a step (c) of measuring current generated by applying a voltage between the electric current power electrode and the output electrode to determine on the basis of the current which of the high or low resistant state the non-volatile logic circuit has.

2. The method of claim 1, further comprising the following step between the step (a) and the step (b):
    applying a voltage Vin to the first and second input electrodes and a voltage Vreset, where Vreset>Vin, to the control electrode to reset the non-volatile logic circuit.

3. The method of claim 1, wherein:
    in the step (b),
    a first input signal which is either true or false is input to the first input electrode, and
    a second input signal which is either true or false is input to the second input electrode, and
    in the step (c),
    the high resistant state corresponds to false of logical disjunction on the basis of the first and second input signals, and
    the low resistant state corresponds to true of logical disjunction on the basis of the first and second input signals.

4. The method of claim 1, further comprising the following step between the step (a) and the step (b):
    turning off the non-volatile logic circuit.

* * * * *